United States Patent [19]
Silverman

[11] 3,979,591
[45] *Sept. 7, 1976

[54] METHOD AND APPARATUS FOR TRANSFERRING A PATTERN ON AN OVERLYING WEB BY LASER BURNING INTO AN UNDERLYING WEB

[76] Inventor: Daniel Silverman, 5969 S. Birmingham St., Tulsa, Okla. 74105

[ * ] Notice: The portion of the term of this patent subsequent to Aug. 27, 1991, has been disclaimed.

[22] Filed: Aug. 20, 1974

[21] Appl. No.: 498,954

Related U.S. Application Data

[63] Continuation-in-part of Ser. No. 262,290, June 13, 1972, Pat. No. 3,832,547.

[52] U.S. Cl. .............................. 250/317; 250/319; 346/76 L
[51] Int. Cl.² ......................................... G03C 5/16
[58] Field of Search ........... 250/316, 317, 318, 319; 346/76 L

[56] References Cited
UNITED STATES PATENTS

| | | | |
|---|---|---|---|
| 2,616,961 | 11/1952 | Groak | 250/316 |
| 3,474,457 | 10/1969 | Becker | 250/316 |
| 3,739,088 | 6/1973 | Landsman | 346/76 L |
| 3,832,547 | 8/1974 | Silverman | 250/319 |

Primary Examiner—Craig E. Church

[57] ABSTRACT

In the field of the storage and retrieval of information, information records in the form of patterns of microspots of small size and high packing density are formed on a record web by the use of a focussed first laser beam, of a first level of intensity, to evaporate or burn away material to form microperforations in a thin layer of opaque first material on a web of transparent plastic. This invention covers the process of preparing a facsimile record of the pattern of microspots on a master record by exposing a second record web through the microperforations in the first web to a constant intensity focussed second laser beam of less intensity than the first level of intensity. Also means are shown for using an optical pattern on a first layer to control a laser to burn openings into an opaque underlying layer.

22 Claims, 10 Drawing Figures

U.S. Patent  Sept. 7, 1976  3,979,591
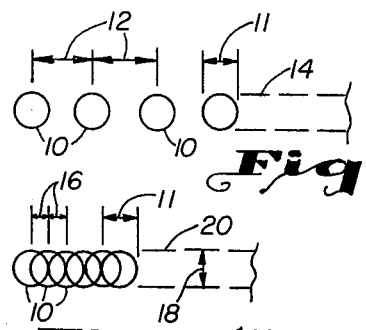
Fig. 1A.
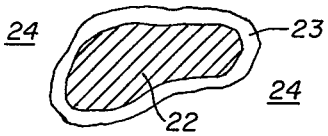
Fig. 1B.
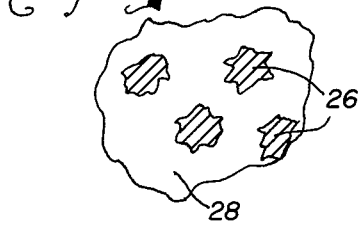
Fig. 1C.
Fig. 1D.
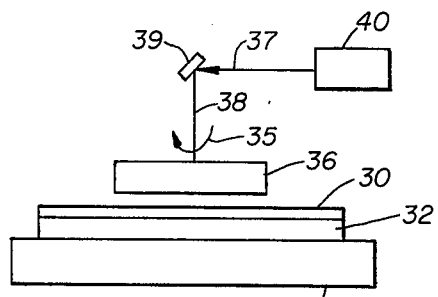
Fig. 2.
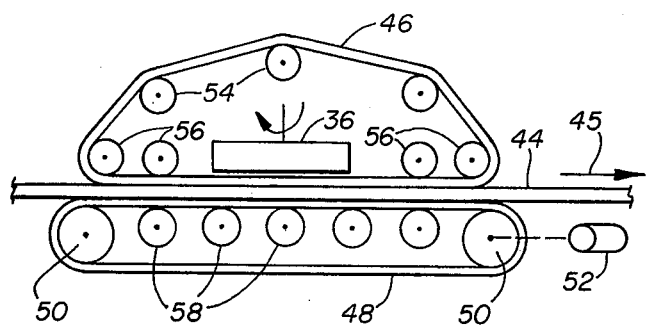
Fig. 3.
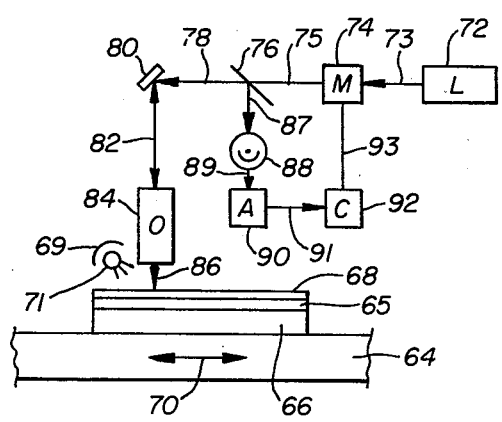
Fig. 4.
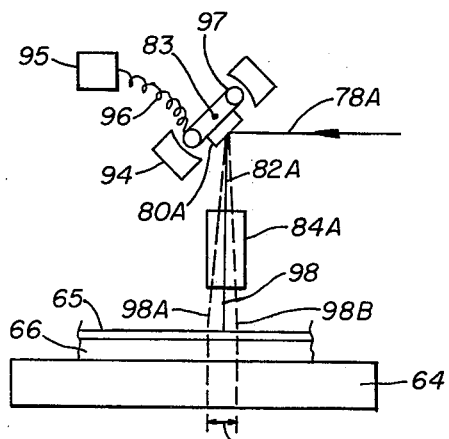
Fig. 5.
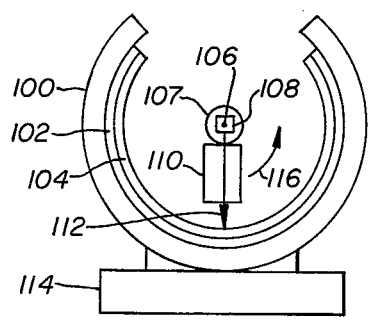
Fig. 6.
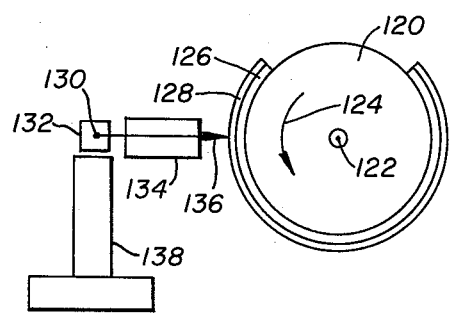
Fig. 7.

METHOD AND APPARATUS FOR TRANSFERRING A PATTERN ON AN OVERLYING WEB BY LASER BURNING INTO AN UNDERLYING WEB

CROSS INDEX

This application is a continuation in part of my copending application Ser. No. 262,290, filed June 13, 1972, entitled; Method and Apparatus for Transferring a Unique Micropattern of Microperforations in a First Metal Layer to an Underlying Metal Layer, now U.S. Pat. No. 3,832,547. Applications Ser. No. 262,290 is entered into this application by reference.

Reference is made to U.S. Pat. No. 3,474,457 issued to Becker, dated Oct. 21, 1969 entitled; Laser Recording Apparatus and to U.S. Pat. No. 3,774,172 issued to Daniel Silverman, dated Nov. 20, 1973 entitled; Random Access Multiple Disc Optical Information Storage System.

This patent application is related also to U.S. Pat. No. 3,677,465 issued to Daniel Silverman and Everett A. Johnson, dated July 18, 1972 entitled; Method and Apparatus for Authentication of Information Records.

FIELD OF THE INVENTION

This invention is concerned with the storage and retrieval of information in the form of patterns of spots of small size and high packing density on a record web, in the form of strips, discs, and webs. More particularly, it is concerned with the preparation of the information record and of duplicate facsimiles of the information record, particularly where the spots are recorded on the record medium by means of a modulated high intensity beam of coherent radiation, such as a laser beam.

This invention is more broadly concerned with the transference of more general patterns, random or regular, made up of separate microperforations or contiguous or overlapping microperforations, to form large perforations of irregular shape, etc. The individual micropatterns or microperforations need not have importance as bits of information, but more generally, the pattern as a whole is the important quantity. In general, the master pattern will be in a thin sheet of high melting point metal bonded to a laser transparent sheet of plastic, glass or other material, so that isolated areas of metal of the pattern can be completely surrounded by metal-free areas.

PRIOR ART

In the art of information storage and retrieval, there has been wide use of photographic film as the information medium, with exposure resulting from a flying spot on the face of a cathode ray tube (CRT). More recently the CRT has been displaced by a focussed beam of coherent electromagnetic radiation from a laser, since such a focussed beam can be made of much smaller size, and thus can produce patterns of higher packing density.

The use of a focussed laser beam of high intensity permits preparation of optical records of a non-photographic nature on record media which are of such a nature the high intensity laser beam can burn or evaporate material from a thin opaque layer, such that a transparent opening is formed through the opaque layer, or conversely an opaque spot is formed on a transparent record, or a non-reflecting spot is formed in a reflecting layer, etc.

Since such a record may carry as many as $10^9$ individual spots it takes a long time to prepare the record, and in case a copy is desired, it takes an equally long time to duplicate the record by a simultaneous reading and writing operation.

SUMMARY OF THE INVENTION

This invention is concerned with a system for preparing a suitable master record by any desired means, including the use of a pulsed focussed laser, and of duplicating the master record rapidly and inexpensively to form a facsimile record of said information, which can potentially be used in place of the master record. The object of this invention is thus to provide a method and apparatus for preparing a master record of information micro spot patterns and preparing facsimile records of the master record by superimposing the master web on top of the facsimile web and irradiating the facsimile web through the micro perforations in the master web with a continuous focussed laser beam of selected intensity to burn the opaque material of the facsimile web in the same pattern of microperforations.

While the primary object is related to spaced information spots or bits, where the size and spacing are extremely small, a further important object is to prepare facsimile patterns in thin sheet material, such as metal or organic material, from a master pattern in a thin sheet material such as metal, where both sheets may be mounted on and attached to laser transparent sheets, so that the patterns may comprise large areas of perforation, surrounding areas of metal which may be imperforated.

Another important object is to transfer an optical pattern on an overlying web by laser burning into an underlying web, in which the optical pattern controls a pulsed laser.

Reference is made to the copending application No. Ser. No. 262,290, now U.S. Pat. No. 3,832,547. of which this application is a continuation in part, and which is entered as part of this application by reference. In the drawings and specifications of Ser. No. 262,290 it is clearly taught the basic process of this invention, namely the preparation of a master web comprising a layer, or strip or sheet of a first material carrying a pattern of perforations, or a pattern of opaque and transparent areas.

These can be micropatterns of microperforations, or can be macropatterns of regular, irregular or random perforations, or large areas, which are to be transferred to an underlying facsimile web. This transfer is accomplished by pressing the two layers into intimate contact, and sweeping a focussed laser beam of constant intensity over the entire area of the master web in a series of parallel tracks, so that the focussed laser beam will pass through the transparent or perforated areas in the master web and will be focussed on the surface of the underlying web and will burn an identical pattern in the facsimile web.

As fully described in Ser. No. 262,290 we are concerned with regular X-Y patterns but in which the microspot spacings and size are so small that a stop-position-burn-move operation cannot be reliably depended on. Also we are concerned with copying random patterns of spots of the same or different size, including microperforations of dimensions and spacing as small as 0.001 inch or less. Also we are concerned with patterns in which the spots are extremely small and must be accurately positioned-such as in the preparation of color masks for color television tubes.

Also in the manufacture of irregularly shaped parts of thin metal sheets such as springs, marks, gears, filters, etc.

The master record may be formed in a regular pattern, by the method disclosed by Becker in which a pulsed focussed laser burns spots along a line on a thin metal sheet on a drum turning at constant speed, and the modulation or pulsing is controlled by computer in terms of the rotational angle of the drum.

Or the master can be made by means of an optically reduced pattern on a sheet and precisely photo etching the pattern into a sheet of high melting temperature metal. The copies or facsimiles can then be produced without technical skill by the method of this invention.

In Ser. No. 262,290 it was taught in FIGS. 1, 2, 3 and 4 how to prepare the master web by burning holes by means of a pulsed focussed laser, by relatively moving the laser beam and the web, and pulsing the laser at proper relative positions, or at proper times, to create the desired pattern. It was pointed out that the most useful application was for the transfer of information patterns of closely packed microperforations representating bits of information, such as shown in FIGS. 9 and 10.

It was further taught that if the two webs comprise metal films, that the top web must be either of higher melting point than the lower web, or it must be thicker, or of higher heat conductivity, etc.

Further it was shown in FIGS. 5A, 5B, 6, 7, and 8 how the micropattern in the master web could be transferred to the underlying web.

In this application, description and adaptations of the basic principles will be broadened to include not only regular micropatterns of microperforations, but also to irregular and random micropatterns; also to include irregular and random patterns of macroperforations, or more generally to large areal patterns of opague and transparent areas, where, for example, small areas of metal film are surrounded by large areas where the metal has been burned away. This means, of course, that an underlying support film of plastic, glass or other laser transparent material must be provided to which the metal film is bonded prior to preparing the master pattern.

Thus the pattern could be isolated opaque areas of the shape of alphanumeric characters surrounded by transparent space, so that the facsimile can be a relief sheet such as for printing, or can be a sheet for electrostatic printing, etc.

Also, the patterns can be simple outlines of selected shapes so that as the end product the underlying web, which can be one or a plurality of separate intricately shaped metal pieces, such as used in micromechanisms, such as springs, gears, cams, ratchest etc.

Of course, the facsimile web need not be metal, but can be of organic material such as woven cloth, where the outlines describe appropriate pattern shapes.

In this application it will be taught other ways to prepare the master web, such as by sweeping a focussed laser completely over the surface of the web, which has been prepared on its surface with the desired optical pattern in reflecting and non-reflecting areas, or black and white areas, etc, and to control the intensity of the laser in terms of the reflectivity, or color etc. of the surface optical pattern, also other ways will be shown in which the sweeping beam can be swept across the surface of the master web, such as by forming the webs into a cylindrical form and scanning the laser beam rotating radially about the axis of the cylinder.

Also the sweeping beam can be swept in a raster pattern of a plurality of parallel rows, by deflecting the beam in two orthogonal directions by electrical crystals, or by rotating mirrors etc.

Also it will be taught that the sweeping beam, while moving in the X direction, for example, can be oscillated in the Y direction over a limited area, such as by an oscillating mirror, for example, so that a wider strip of the master web surface can be covered on each pass of the scanning beam. Since the time required for burning is so short and the speed of mechanical scanning so slow, this expedient is equivalent to speeding up the scanning rate manyfold.

While this invention has been discussed in terms of relatively low power lasers in combination with thin metal films, the basic process can be applied to the case of thicker metal and/or organic sheets or plates, or in general, wherever many copies must be made of selected patterns. Since the precision and power of cutting with a laser is so high, this opens the possibility of construction of large precision metal parts to this process.

Also, the words "sheet", "strip", "web", "record", will means the material which comprises the master or the facsimile. These can be a single "layers" or "films" of metal or other materal, or they can be composite webs of an underlying layer of laser transparent (inactive) material such as plastic or glass, etc. and an overlying bonded layer of metal or other (active) material which may be organic or inorganic.

BRIEF DESCRIPTION OF THE DRAWINGS

These and other objects, details and advantages of this invention and a better understanding of the principles and details of the invention will be evident from the following description taken in conjunction with the appended drawings, in which:

FIGS. 1A, 1B, 1C, 1D illustrate various types of patterns transferrable by the method of this invention.

FIG. 2 illustrates schematically the basic process of this invention.

FIG. 3 illustrates one embodiment for transferring a master pattern on a master web loop to a continuous strip of facsimile web.

FIG. 4 illustrates an improved embodiment of this invention.

FIG. 5 illustrates an improvement of FIG. 4.

FIGS. 6 and 7, illustrate two embodiments for relatively scanning a laser beam and the superimposed master and facsimile webs.

DESCRIPTION OF THE PREFERRED EMBODIMENT

While the subject is fully covered in Ser. No. 262,290, it may be well to discuss again the general subject of "burning", "cutting", "melting", "evaporation", etc. It is well known that a focussed laser beam, even of low wattage, can present a high power beam over a small area, which when directed to metal and other materials, causes softening, melting, oxidation, sublimation and other chemical actions, which result in the alteration and/or removal of an area of the material. Since it is not known exactly what happens in each case, it will be understood that the terms of "cutting", "burning", "melting", "evaporation", etc. will mean the process of removing material. Also the term "melting" point and "boiling" point and "cutting temperature" will indicate the general value of temperature of the material, at which the material is removed or cut by the laser beam.

It will be clear that in order to cut the underlying material through perforations in the overlying material, without cutting the overlying material (and destroying the master pattern) the melting point of the master sheet must be higher than that of the lower sheet, or, the upper sheet must be more massive and thus have higher thermal capacity than the lower sheet, or, the upper sheet must be thicker than the lower sheet, or the upper sheet must have a higher thermal conductivity than the lower sheet, or, the laser beam must have a sharper focus on the lower sheet, etc.

Referring now to the drawings and in particular to FIG. 1, there is shown various types of patterns which are amenable to handling by the apparatus and methods of this invention.

FIG. 1A shows a series of circular (or other shaped) perforations 10, of diameter 11 spaced apart by distances 12, along a track 14. This is the conventional information storage format.

FIG. 1B shows a plurality of perforations of diameter 11, along a track 20, but the spacing is now 16, which is less than the diameter 11. Thus by reducing the spacing 16 to a small fraction of diameter 11, a smooth-edge, parallel-edge strip or cut of width 18 can be made in the material.

FIG. 1C shows a closed loop cut, or track 23 enclosing an irregular shaped area 22 of material, and a surrounding area 24 of the same material. The enclosed area could be of any desired shape such as gears, cams, alphanumeric characters, etc. that might need to be made. If a short run of such parts are needed, this invention provides a quick and simple way to prepare them, and avoids the cost of expensive dies, etc.

FIG. 1D shows a situation where the opaque, uncut areas 26 are small and the cut-away area 28 is large. The areas 26 could again be small mechanical parts or printing type characters, etc. Of course, to make the type of pattern as in FIG. 1D the material (say metal) sheet must be bonded to a carrier sheet of laser transparent material such as plastic, glass, etc.

In FIG. 2 is shown schematically a mechanism for scanning a laser beam over the complete surface of the master web. This is patterned after the mechanism of FIGS. 6 and 7 of Ser. No. 262,290. It can also be other mechanical systems, such as a reciprocating head moving on a track operated by a crank and arm mechanism (like a "shaper" machine) or a rack and pinion drive. It can also include slower movement in one direction (the cutting direction) and fast return, with perhaps the laser being turned off during the return movement. It also includes the embodiments of FIGS. 4, 5, 6 and 7 as will be further described.

FIG. 2 shows a master web containing perforations in an opaque sheet 30 or more generally areas of an opaque material of greater laser resistance to cutting, than the material of the facsimile web 32, with adjacent or surrounding areas of a laser transparent material. The facsimile web 32 would comprise generally a layer of laser cutable material on a laser transparent (uncutable) material. These master and facsimile webs might correspond to the webs 24, 26 and 74, 76 respectively of FIGS. 5A and 5B of Ser. No. 262,290.

A rotating optical system 36 corresponding to 84 of FIGS. 6 and 7 of Ser. No. 262,290. This system 36 rotates about axis 38 and is supplied with a laser 40, whose beam 37 projects to a mirror 39 and then axially to the optical system 36. The webs 30 and 32 can be of limited size and can be placed on a work table 33 that moves in accordance with arrows 34.

In FIG. 3 is shown a modification of FIG. 2 in which the facsimile web is a long sheet or strip, out of which many facsimile copies are to be cut. The master record can be in the form of a closed loop web, which runs in contact with the top surface of the facsimile web 44, which moves in the direction 45.

The master loop 46 is supported on a plurality of rollers 54 so as to provide space for the optical system 36. Of course, the master web can also be a long strip like the web 44. The principle drive is a belt loop 48 driven by rollers 50, through motor 52, support rollers 58, under the belt 48, and pressure rollers 56 press the master web, the facsimile web and the belt 48 together so that they all run without relative displacement. The apparatus of FIG. 3 is adaptable to high production automatic operations with essentially minimum manual attendance. Of course, other equivalent mechanical systems can be used in place of that shown in FIG. 3.

Reference is made to U.S. Pat. No. 3,774,172, which has been made of reference in this application. In FIGS. 6A and 6C there are shown photosensor means 98A and 98B, which are adapted to detect light from the laser focussed on the record surface 74 and scattered back. Before the perforation is made, light scattered back will be high intensity but after a perforation is made, the light back-scattered will be less. Thus by measuring the response of the sensor 98, it can be determined whether the beam 86A or 86B is directly over a perforation, or over an unperforated area of the web.

In FIG. 4 is shown another embodiment of an optical system in which back-scattered light can be detected. Here a master web comprising base layer 66 and active layer (such as metal) 65 on a table 64 capable of translation in accordance with arrows 70. A laser 72 provides beam 73 through light modulator (light gate) 74. The modulated beam 75 goes through partially reflecting mirror 76, and, as beam 78 to mirror 80 and beam 82 to optics 84, which brings the beam 86 to a focus at the surface of the metal layer 65. When the light gate 74 is open, the focussed beam is intense enough to burn a perforation in the metal layer 65. When the light gate is closed, a small amount of laser light passes through to the surface 68. This is sufficient to provide back scattered (reflected) light back through optics 84, beam 82, mirror 80, beam 78 to partially reflecting mirror 76, where the beam is deflected as beam 87 to the photosensor 88.

The electrical signal generated by the photosensor 88 due to the reflected light from the surface of the master web, through beam 86, goes by leads 89 to amplifier 90, to control means 92 through leads 91, and by leads 93 to the light modulator or light gate 74.

The light back-scattered from the master web 65 and 66 can be reflected by the metallic surface of 65, which when the metal is unperforated will reflect light, and when the metal is perforated (the reflective surface is removed) will not reflect light. It will be clear also, that a pattern of black and white can be printed or otherwise transferred to the surface of 65. Here the white part will reflect or scatter back light, whereas the black part will not. This type of pattern can be transferred to the surface of metal layer 65 by printing, xerography, photography, silkscreening, etc.

It will be clear also that a preprinted sheet 68 of the desired dimension, can be attached as by adhesive to the top surface of metal layer 65 so that the light and dark, or color pattern recorded thereon, can be used to control the light gate.

Let us consider the method of operation with a printed pattern 68, in which black and white, or non-reflecting and reflecting areas, form the pattern. There is a relative scan of the beam 86 over the surface of the pattern 68. Assume that the focussed beam 86 is of lower intensity, by the fact that the light gate 74 is almost closed, then, because of the non-reflecting surface 68, little or no light goes back through the optics 84 and to the sensor 88 and the control signal from amplifier 90 is weak. Thus the control 92 leaves the gate partially closed. However, when the pattern passing under the beam 86 becomes reflecting, the large signal output from 90 to control 92 causes the gate to open, and the high energy laser beam becomes focussed on the layer 65 and causes a perforation to be made. This removes the reflective surface and the beam is again cut off. However, as the beam 86 scans further it again sees reflective surface and the strong beam again comes on.

As a practical matter such a control will keep calling for strong beam whenever the sensor receives sufficient light so that if the beam scans the entire surface of 65 (or 68) in contiguous parallel strips, then all of the reflecting area of the metal 65 will be removed and all of the non-reflecting area will remain.

Various methods of scanning the beam 86 over the surface 68, 65 can be devised. One shown in Ser. No. 262,290 in FIGS. 6 and 7 can be conveniently used.

Another method is to wrap the master web around a drum with the surface 68 outermost and rotate the drum at high speed while moving the optics 84 and beam 86 along an element of the cylindrical surface of the web. The beam 86 will then mark out a helical pattern on the surface so as to scan over the entire surface. Also, the web 65, 66, 68 can be formed into a cylindrical form with the surface 68 innermost. The beam 86 can then be directed radially and rotated about the axis of the cylinder as it is moved axially. These types of operation will be explained in detail in connection with FIGS. 6, 7.

While in FIG. 4, I have shown a weak beam passing from laser 72 to illuminate the surface 68, it is possible also to have a separate luminous source 71, 69 to illuminate the surface under the optics 84. It is possible also to have the light sensors positioned as in U.S. Pat. No. 3,774,172. However, the embodiment of FIG. 4 is preferred.

Normally, to get a high power beam impinging on the surface 68 from a laser of minimum power output, the beam 86 will be brought to a sharp focus at the surface of the metal sheet which is to be cut. Therefore, the area of the metal film 65 which is cut is quite small, and may be the order of 0.001 inch, or less. Thus, the rows of scan of the beam must be closely spaced, and because of the limited speed of the mechanical parts it may take a long time to cover the entire area.

In FIG. 5 I show a modification of the embodiment of FIG. 14 in which the mirror 80A (corresponding to 80) is mounted on a coil 97 which is adapted to oscillate about an axis 83. The coil 97 is positioned in the magnetic field of magnet 94, and supplied with an AC. current from oscillator 95 through leads 96. Thus the beam 98 through the optics 84A can be deflected to positions 98A to 98B. Since the cutting action of the beam 98 is very rapid, the oscillation of the beam 98 can be very rapid. Thus the cutting beam moving in a direction parallel to axis 83 scans a broad strip of dimension 99, which can be many times wider than the focussed beam 98. Thus for a fraction of the number of mechanical scans, the entire area can be scanned by beam 98. Of course, there are other ways well known in the art to deflect the beam in an oscillatory manner over a limited amplitude.

If a greater powered laser is used, the focussing does not need to be so sharp. Therefore a longer focal length optics 84 can be used. This permits other means for scanning the beam, by means of electrical crystals, and revolving mirrors, which are well known in the art.

The system shown in FIGS. 4, 5 will transfer an optical pattern on an overlying surface to an underlying surface by controlling (pulsing) a laser so as to focus the laser onto the metal surface and passing intense optical energy in accordance with the optical properties such as color, light and dark, and/or reflectively, of the pattern. While I have given as an example the burning of a thin metal layer, the underlying area could be a thin or a thick metal layer, or an organic material layer such as plastic or woven material, etc. Also the pattern can be positioned on the surface of the web to be cut, or it can be on a sheet or web (such as paper, plastic, etc.) positioned on top of the master web.

It will be clear also, that while I have described FIG. 4 in terms of a control 92 that increases the laser power whenever the reflected light increases, the operation can be controlled in reverse. That is, the laser power increases when the light decreases. In this case, the record or pattern on top of the master web can be a reflective metal film on a laser transparent sheet, with a precut pattern. Now, whenever the beam 86 sees the reflective (uncut) surface of the film, the laser power is low. When the beam 86 sees a cut-away portion of the reflective surface, the cut being non-reflective, the high laser power is applied.

This condition compares to that in SN 262,290 where there is no optical control on the beam, but the patterned layer (now the master web) serves as a simple mask shielding the underlying facsimile layer. As mentioned above, the pattern can be an optical pattern on a disposable (cutable) web of paper, etc. Or it can be a pre-cut metal web, which optically controls the beam which is pulsed in accordance with the optical signal. Or if the metal is laser resistive, it can (mechanically) shield the facsimile web from the continuous laser beam.

In FIGS. 6, 7 are shown two embodiments, other than those shown in FIGS. 6, 7 of Ser. No. 262,290 and FIGS. 4, 5. In FIG. 6 the sheet to be cut (that is, the underlying facsimile sheet 102) is beneath the overlying master sheet 104 which can be an optical pattern to control the beam, or it can be a metal layer of such thermal characteristics that it can accept the continuous laser beam without being cut, thus shielding the underlayer 102, except where there is precutting of the sheet 104, so that the unshielded beam can focus directly on the lower sheet.

The sheets 102, 104 are formed closely to the internal circular cylindrical surface of the housing 100. They can be held by any means, such as vacuum, etc.

The optics 110 is attached to an axial tubular shaft 107 rotating about its axis. The laser beam 106 passing along the axis is deflected by mirror 108 radially to the surface 104. The shaft 107 and optics 110 rotate in the direction of the arrow 116. Means are provided to axially relatively move the shaft 107 with respect to the housing 100 to sweep over the entire area. The improvement of FIG. 5 can, of course, be used here also.

In FIG. 7 is shown a similar embodiment except that the sheets 126, 128 are attached to the outer surface of a cylindrical drum 120 that rotates about axis 122 in the direction of arrow 124. Here the mirror 132, beam 130, optics 134 and focussed beam 136 perform as in the case of FIG. 16.

Reference is made to FIG. 8 of Ser. No. 262,290. Here the focal point of beam 98 is shown of minimum diameter 108 at the surface of the second layer, more specifically the focal point is preferably on the surface of the second material of the second layer. Then by making the layer 24, 26 of sufficient thickness, the beam 98 is de-focussed at the surface 26 of the master web, that is, at the surface of the first metal layer, and is thus of lower power per unit area, whereas, the beam at the focal point, at the surface of the second material 76, of the second layer 74 will be of maximum power per unit area. Thus even though the first and second materials may be the same, because of the higher-power of the beam 98 on the lower metal perforations will be burned onto the second layer, but not into the first layer.

Such a system can be described as one in which the first material layer lies in a portion of the laser beam which is of lower unit power, while the underlying second material lies in a portion of the laser beam which is of higher unit power, sufficient to burn away said second material while not burning away the first material. By this means identical material can be used in the first master and second (facsimile) webs.

It is possible also to get different relative action of the laser beam on the first and second layers, even if the materials of these layers are the same, by making the upper layer more massive, and thus of greater heat conductivity and greater thermal capacity.

Another possible condition, is one in which the first material is of higher melting point than the lower material.

The method of FIG. 4 uses a first material which provides optical control, but no thermal masking of the second material. The first material can be a printed pattern on a sheet of paper, for example, where the paper is the first material. Or it can be printed directly on the material to be cut, in which case the first material is the physical film of ink or paint, printed onto the surface.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

I claim:

1. A system for directly transferring a micropattern of microperforations in a first metal web to an underlying second web, comprising:
   a. a master record web comprising a first metal layer carrying a first micropattern of microperforations, said first metal layer composed of a first metal, of a first thickness of a first thermal characteristic;
   b. a facsimile record web comprising a second layer, said second layer composed of a second material, of a second thickness of a second thermal characteristic;
   c. means to place said master web superimposed in contiguous relation on top of said facsimile record so that each web remains in fixed relation with respect to the other web;
   d. optical means to focus a continuous beam of laser radiation of a selected constant level of intensity and to direct said beam onto the surface of said master web, and means to relatively move said beam of laser radiation over substantially the entire area of said micropattern on said master web in a plurality of parallel paths, at a selected velocity; and wherein
   e. said first metal has a higher melting point than the melting point of said second material;
   whereby said focussed beam will penetrate said microperforations in said first metal layer and irradiate said second layer below, and will burn microperforations in said second layer in a second micropattern which is identical to said first micropattern.

2. The system as in claim 1 in which said micropattern of microperforations comprises overlapping microperforations in the form of macroperforations.

3. The system as in claim 2 in which said first metal web is bonded to a layer of laser transparent material and said macroperforations include large patterns in which areas of said first metal are surrounded by areas of said web from which said metal has been completely removed.

4. The system as in claim 1 in which said second material comprise a non-metal of thermal characteristic such that said second material will be evaporated at a lower temperature than said first metal.

5. The system as in claim 1 in which said microperforations are smaller than 0.001 inch diameter.

6. The system as in claim 1 in which said directed laser radiation is focussed on the surface of said facsimile record web through said microperforations in said first metal layer.

7. The system as in claim 1 in which said microperforations in said first metal layer are burned through said first metal layer by a pulsed focussed beam of laser radiation.

8. The system as in claim 1 in which said means to relatively move said optical means over substantially the entire area of said master web in a plurality of parallel paths comprise;
   a. a rotating means carrying at least one optical means and means to direct said laser beam through said optical means substantially parallel to the axis of rotation, and substantially perpendicular to the plane of said record webs; and
   b. means to simultaneously relatively traverse said webs under said rotating means.

9. The system as in claim 8 including means to oscillate said laser beam passing through said optical means, at a rapid rate, through a selected angle, in a plane perpendicular to the direction of the path followed by said laser beam over said master web, whereby a path of selected width is swept out by said laser beam with each traverse of said beam across said master web.

10. The system as in claim 11 in which said luminous radiation is derived from said laser beam.

11. A system for transferring a preselected pattern of optically differentiatable areas on a first material capable of being penetrated by a focussed laser beam to an underlying opaque material capable of being cut by a focussed laser beam comprising:
   a. a first web comprising a selected material carrying said pattern in the form of areas of contrasting optical properties;
   b. said first web superimposed in fixed relation on a second web of material capable of being cut by said laser beam;
   c. a laser providing a beam of laser radiation;
   d. light gate means to control the intensity of said laser beam;
   e. optical means to focus said controlled laser beam onto said second web at a selected location;
   f. means to apply constant luminous radiation to the surface of said first web at said selected location;
   g. means to detect luminuous radiation back-scattered from the surface of said first web at said selected location;
   h. control means responsive to the intensity of said back-scattered radiation to control said light gate means;
   whereby the intensity of said laser beam will be a function of the intensity of said back-scattered luminous radiation; and
   i. means to relatively traverse said optical means and said webs so as to scan said selected location over substantially the entire area of said pattern.

12. The system as in claim 11 in which said first web comprises a sheet or web carrying a pattern of optically differentiatable areas.

13. The system as in claim 12 in which said sheet or web comprises fibrous material, on the surface of which, said pattern is applied.

14. The system as in claim 12 in which said sheet or web comprises a photographic sheet with said pattern developed on its surface.

15. The system as in claim 12 in which said sheet or web is attached to the surface of said second web, as by adhesive means.

16. The system as in claim 11 in which said first web is a thin coating on the surface of said second web, said coating carrying said pattern of optically differentiatable areas.

17. The system as in claim 11 in which said second web is a sheet of metal.

18. The system as in claim 11 including means to oscillate said laser beam passing through said optical means, at a rapid rate through a selected angle, in a plane perpendicular to the direction of the path followed by said laser beam over said pattern, whereby a path of selected width is swept out by said laser beam with each traverse of said beam across said pattern.

19. The system as in claim 11 in which said first and second webs are planar and said optical means moves parallel to itself in a plane parallel to said webs.

20. The system as in claim 11 in which said first and second webs are wrapped around a rotating drum and said laser beam is projected radially inwardly to the surface of said webs.

21. The system as in claim 11 in which said first and second webs are placed against the inner surface of a cylindrical shell, and said optical means is rotated about the axis of said shell, with said laser beam projected outwardly, radially to the surface of said webs.

22. In a system in which information is stored on a master record web in the form of a unique micropattern of microperforations in a first thin metal layer having a first melting point, the method of duplicating said information onto a facsimile record web, said facsimile record web comprising a second layer of a second material and adapted to be perforated by irradiation by a beam of coherent laser radiation focussed on its surface, comprising the steps of:
   a. placing said master record web on top of said facsimile record web in intimate contact.
   b. directing a beam of coherent laser radiation of selected constant level of intensity through said microperforations in said first metal layer, directed to and focussed on the surface of said second material, by relatively sweeping said beam across the surface of said first web; and
   c. adjusting the intensity of said focussed beam in step (b) so as to form microperforations in said second material layeer without forming microperforations in said first metal layer;
   whereby microperforations are formed in said second material in a micropattern identical to said first micro pattern in said first metal layer.

* * * * *